United States Patent
Zheng et al.

(10) Patent No.: US 11,245,067 B2
(45) Date of Patent: Feb. 8, 2022

(54) HALL SENSORS WITH A THREE-DIMENSIONAL STRUCTURE

(71) Applicant: GLOBALFOUNDRIES Singapore Pte. Ltd., Singapore (SG)

(72) Inventors: Ping Zheng, Singapore (SG); Bin Liu, Singapore (SG); Eng Huat Toh, Singapore (SG); Shyue Seng Tan, Singapore (SG); Ruchil Kumar Jain, Singapore (SG); Kiok Boone Elgin Quek, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 145 days.

(21) Appl. No.: 16/671,613

(22) Filed: Nov. 1, 2019

(65) Prior Publication Data
US 2021/0135095 A1 May 6, 2021

(51) Int. Cl.
*H01L 43/06* (2006.01)
*H01L 27/22* (2006.01)
*G01R 33/00* (2006.01)
*H01L 43/14* (2006.01)

(52) U.S. Cl.
CPC ........ *H01L 43/065* (2013.01); *G01R 33/0052* (2013.01); *H01L 27/22* (2013.01); *H01L 43/14* (2013.01)

(58) Field of Classification Search
CPC ..... F16J 15/3288; F16J 15/02; F27D 99/0073
See application file for complete search history.

(56) References Cited

U.S. PATENT DOCUMENTS

| 8,159,219 | B2 | 4/2012 | Estrada et al. |
| 8,426,936 | B2 | 4/2013 | Minixhofer et al. |
| 9,714,988 | B2 | 7/2017 | Eckinger et al. |
| 10,050,082 | B1 | 8/2018 | Liu et al. |
| 10,333,056 | B2* | 6/2019 | Liu .......... H01L 27/22 |
| 2011/0234218 | A1 | 9/2011 | Lagouge |
| 2012/0007597 | A1* | 1/2012 | Seeger .......... G01R 33/07 324/244 |

(Continued)

FOREIGN PATENT DOCUMENTS

TW 201602609 A 1/2016

OTHER PUBLICATIONS

C. Sander, C. Leube and O. Paul, "Novel compact two-dimensional CMOS vertical Hall sensor," 2015 Transducers—2015 18th International Conference on Solid-State Sensors, Actuators and Microsystems (TRANSDUCERS), Anchorage, AK, 2015, pp. 1164-1167.

(Continued)

*Primary Examiner* — Dominic E Hawkins
(74) *Attorney, Agent, or Firm* — Thompson Hine LLP; Anthony Canale

(57) ABSTRACT

Structures for a Hall sensor and methods of forming a structure for a Hall sensor. The structure includes a semiconductor body having a top surface and a sloped sidewall defining a Hall surface that intersects the top surface. The structure further includes a well in the semiconductor body and multiple contacts in the semiconductor body. The well has a section positioned in part beneath the top surface and in part beneath the Hall surface. Each contact is coupled to the section of the well beneath the top surface of the semiconductor body.

20 Claims, 4 Drawing Sheets

(56) References Cited

U.S. PATENT DOCUMENTS

| | | | |
|---|---|---|---|
| 2012/0007598 A1* | 1/2012 | Lo | G01R 33/0011 |
| | | | 324/252 |
| 2012/0146130 A1* | 6/2012 | Hirler | H01L 29/4175 |
| | | | 257/329 |
| 2014/0175528 A1* | 6/2014 | Zieren | H01L 43/02 |
| | | | 257/295 |
| 2018/0130849 A1 | 5/2018 | Lee et al. | |
| 2019/0074385 A1* | 3/2019 | Lee | H01L 29/417 |
| 2019/0273011 A1* | 9/2019 | Sung | H01L 21/02236 |
| 2020/0135792 A1* | 4/2020 | Wu | H01L 27/14636 |

OTHER PUBLICATIONS

Wouters et al., "Design and fabrication of an innovative three-axis Hall sensor", Sensors and Actuators A: Physical vol. 237, Jan. 1, 2016, pp. 62-71.

H. Heidari, U. Gatti and F. Maloberti, "Sensitivity characteristics of horizontal and vertical Hall sensors in the voltage- and current-mode," 2015 11th Conference on Ph D. Research in Microelectronics and Electronics (PRIME), Glasgow, 2015, pp. 330-333.

Oh et al., "4-Contact Structure of Vertical-type CMOS Hall Device for 3-D Magnetic Sensor", IEICE Electronics Express, retrieved from the internet at https://www.jstage.jst.go.jp/article/elex/advpub/0/advpub_16.20180854/_article/-char/ja/.

Taiwan Intellectual Property Office, Examination Report received in Taiwanese Patent Application No. 109134160 dated May 24, 2021.

Taiwan Intellectual Property Office, Examination Report received in Taiwanese Patent Application No. 109134160 dated Oct. 7, 2021.

\* cited by examiner

HALL SENSORS WITH A THREE-DIMENSIONAL STRUCTURE

BACKGROUND

The present invention relates to integrated circuits and semiconductor device fabrication and, more specifically, to structures for a Hall sensor and methods of forming a structure for a Hall sensor.

Hall sensors are common types of sensing components found in various commercial products, such as household appliances, gaming systems, construction equipment, utility meters, and motor vehicles, and are based on sensing a magnetic field. A magnetic field is a vector quantity characterized by a position-dependent field strength and a field direction. A magnetic field may exert a force on moving charged particles according to the Lorentz force law. A Hall sensor relies on the production of a voltage difference (i.e., a Hall voltage) across an electrical conductor produced by a combination of a current flowing in the conductor and a magnetic field with a field direction perpendicular to the flowing current. Conventional Hall sensors, which are planar devices, have a low sensitivity when detecting a magnetic field with a field direction that is parallel to a substrate surface on which the Hall sensor is formed.

Improved structures for a Hall sensor and methods of forming a structure for a Hall sensor are needed.

SUMMARY

According to an embodiment of the invention, a structure for a Hall sensor is provided. The structure includes a semiconductor body having a top surface and a sloped sidewall defining a Hall surface that intersects the top surface. The structure further includes a well in the semiconductor body and multiple contacts in the semiconductor body. The well has a section positioned in part beneath the top surface and in part beneath the Hall surface. Each contact is coupled to the section of the well beneath the top surface of the semiconductor body.

According to another embodiment of the invention, a method of forming a structure for a Hall sensor is provided. The method includes forming a well in a semiconductor body having a top surface and a sloped sidewall defining a Hall surface that intersects the top surface. The well has a section positioned in part beneath the top surface and in part beneath the Hall surface. The method further includes forming multiple contacts in the semiconductor body. Each contact is coupled to the section of the well beneath the top surface of the semiconductor body.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
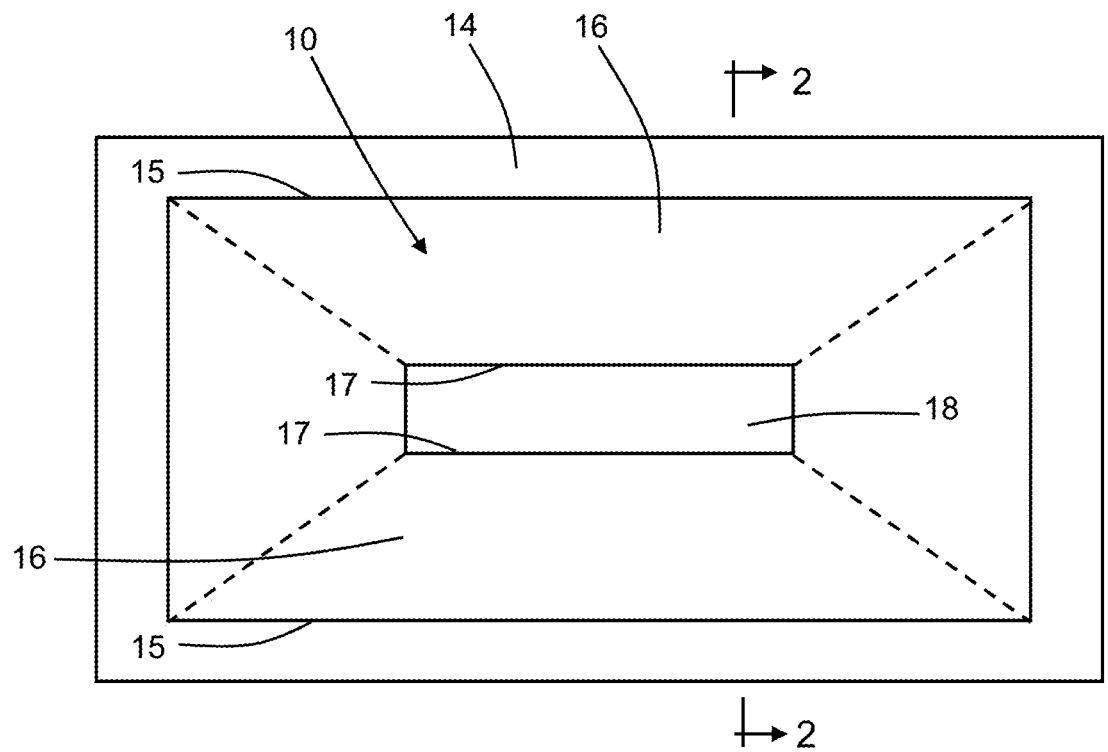
FIG. 1 is a top view of a structure for a Hall sensor at an initial fabrication stage of a processing method in accordance with embodiments of the invention.
Figure 2:
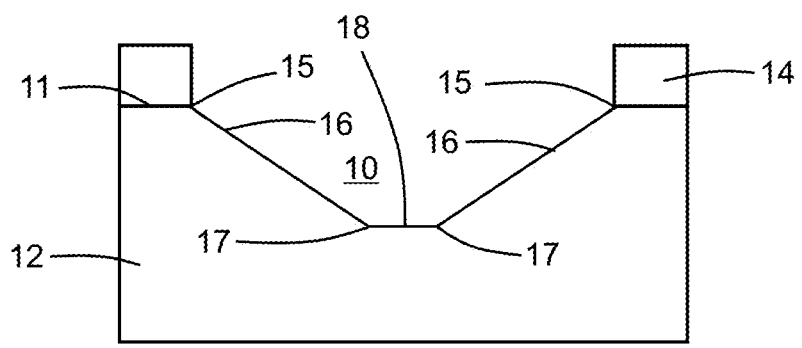
FIG. 2 is a cross-sectional view taken generally along line 2-2 in FIG. 1.

With reference to FIGS. 1, 2 and in accordance with embodiments of the invention, a groove 10 is formed as a cavity or trench in a substrate 12. The substrate 12 may be a bulk wafer composed of single-crystal semiconductor material (e.g., single-crystal silicon) and, in an embodiment, the substrate 12 may have lightly-doped p-type conductivity. In an embodiment, the groove 10 may be formed by lithography and etching processes. To that end, an etch mask 14 is formed over a top surface of the substrate 12. The etch mask 14 may be a hardmask that is patterned by lithography and etching processes to define an opening of a given area at an intended location for the groove 10. The groove 10 is etched in the substrate 12 using one or more etching processes with the etch mask 14 present. Portions of the substrate 12 that are not covered by the etch mask 14 are removed by the etching process.

The groove 10 in the substrate 12 may have a cross-sectional profile produced through a choice of etchant. In an embodiment, the groove 10 may have a V-shaped cross-sectional profile. For example, the etchant may be a wet chemical etchant, such as a solution containing tetramethylammonium hydroxide (TMAH), a solution containing potassium hydroxide (KOH), or a solution containing ethylene diamine and pyrocatechol (EDP). The etchant may exhibit selectivity with regard to crystal orientation of the semiconductor material of the substrate 12 with different etching rates occurring along different crystalline directions. The differential in the etching rates produces the shape for the groove 10. For example, if the substrate 12 contains [100]-oriented silicon, the (100) planes etch at a significantly higher rate than the (111) planes which leads to a self-limiting etching process forming the groove 10 in which the vertical etch rate is significantly greater than the lateral etch rate.

The cross-sectional profile of substrate 12 surrounding the groove 10 includes sidewalls 16 that extend from a top surface 11 of the substrate 12 to a surface of the substrate at the groove bottom 18. The sidewalls 16 define surfaces that are angled or sloped relative to a plane containing a top surface 11 of the substrate 12. In an embodiment in which the substrate 12 contains [100]-oriented silicon having a diamond crystal lattice, the sidewalls 16 may be sloped relative to the plane containing the top surface 11 with an inclination angle of about 35° consistent with the angle of a normal to the [111] planes relative to the [100] surface normal. The sidewalls 16 penetrate from the top surface 11 of the substrate 12 to a given depth into the substrate 12 and intersect with the groove bottom 18, which is laterally arranged between the opposite sidewalls 16.

A surface of the substrate 12, which is exposed at the groove bottom 18, may be contained in a plane that is parallel to a plane containing the top surface 11 of the substrate 12. Each of the sidewalls 16 intersects the surface at the groove bottom 18 at a corner 17 that extends along a lower edge of the sidewall 16. The respective corners 17 are located along opposite sides of the groove bottom 18, which extends laterally from one corner 17 to the opposite corner 17. Each of the sidewalls 16 also intersects the top surface 11 of the substrate 12 at a corner 15 that extends along an upper edge of the sidewall 16. The surface of the substrate 12 at the groove bottom 18 may be rectangular about a perimeter defined by the corners 17, and the top surface 11 of the substrate 12 surrounding the entrance to the groove 10 may likewise have a rectangular shape about a perimeter defined by the corners 15.

Figure 3:
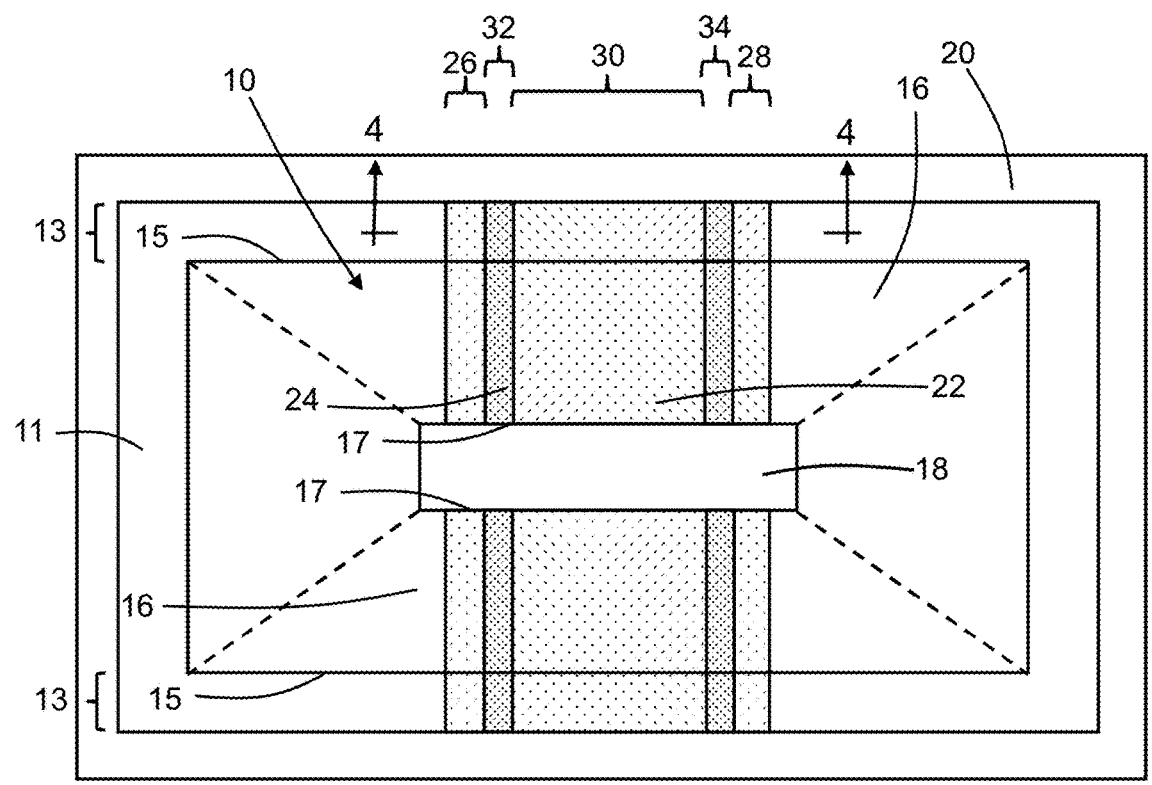
FIG. 3 is a top view of the structure for the Hall sensor at a fabrication stage subsequent to FIG. 1.
Figure 4:
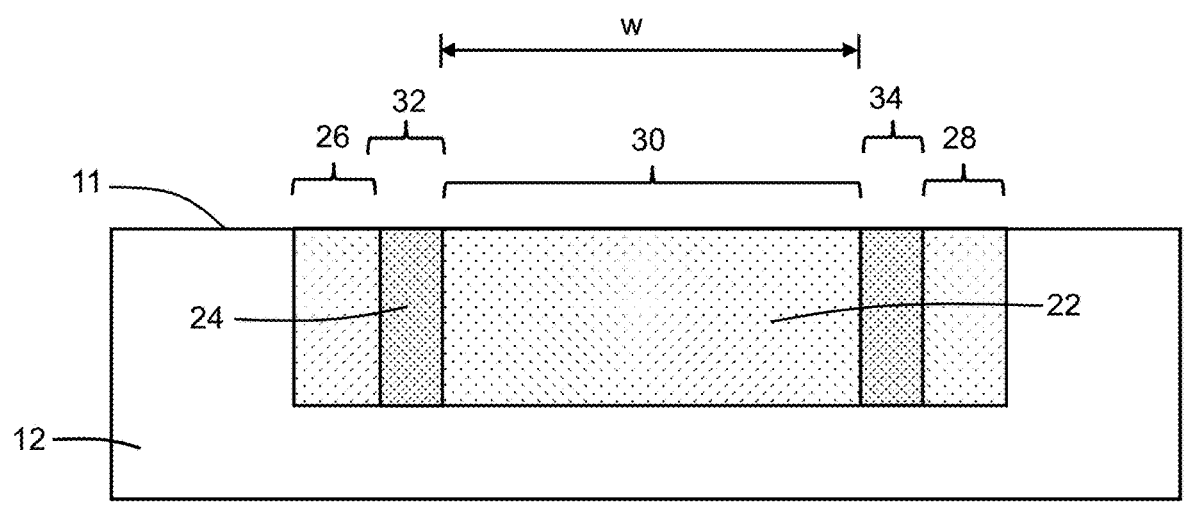
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, the etch mask 14 is removed, and shallow trench isolation regions 20 are formed that surround the groove 10. The shallow trench isolation regions 20 may contain a dielectric material, such as silicon dioxide, that is deposited by chemical vapor deposition into trenches etched in the substrate 12 by a masked etching process, polished, and deglazed. The shallow trench isolation regions 20 are slight larger dimensionally (e.g., in length and width) than the groove 10 such that the corners 15 are surrounded by the shallow trench isolation regions 20. Because of the dimensional difference, portions 13 of the substrate 12 are located as strips at the top surface 11 between the corners 15 and the shallow trench isolation regions 20. The top surface 11 of these portions 13 of the substrate 12 may be flat and planar.

Wells 22, 24 having conductivity types of opposite polarity are formed in the substrate 12 beneath the surfaces at the sidewalls 16 and in the portions 13 of the substrate 12 beneath the top surface 11. The well 22 may be formed by introducing a dopant of one conductivity type by, for example, ion implantation into a portion of the substrate 12 beneath each sidewall 16 of the groove 10 and into the portions 13 of the substrate 12 surrounding the groove 10. The well 24 may be formed by introducing a dopant of the opposite conductivity type by, for example, ion implantation into portions of the substrate 12 beneath each sidewall 16 and into the portions 13 of the substrate 12 surrounding the groove 10. Respective patterned implantation masks may be used to define the selected locations for the wells 22, 24, and are stripped after each of the wells 22, 24 is formed. In an embodiment, the well 22 may be formed before the formation of well 24.

In an embodiment, the semiconductor material of the well 22 may comprise an n-type dopant (e.g., phosphorus or arsenic) effective to impart n-type conductivity, and the semiconductor material of well 24 may comprise a p-type dopant (e.g., boron) effective to impart p-type conductivity. Implantation conditions (e.g., kinetic energy and dose) are selected to form each of the wells 22, 24 with a desired doping profile and concentration. In an embodiment, the wells 22, 24 may be constituted by moderately-doped semiconductor material formed through a selection of the implantation conditions. The wells 22, 24, which are located beneath the top surface 11, each extend to a given depth into the substrate 12 relative to the top surface 11. In an embodiment, the wells 22, 24 may extend to equal depths into the substrate 12 relative to the top surface 11.

The well 22 includes sections 26, 28 that extend as strips in the substrate 12 down the sidewalls 16 of the groove 10 and that are also located in the portions 13 of the substrate 12. The well 22 also includes a section 30 that extends as a strip in the substrate 12 down the sidewalls 16 of the groove 10 and that is also located in the portions 13 of the substrate 12 at the top surface 11. The section 30 may have larger dimensions than either of the sections 26, 28. The well 24 also includes sections 32, 34 as strips extend down the sidewalls 16 of the groove 10 and that are also located in the portions 13 of the substrate 12 at the top surface 11. The section 32 of well 24 is positioned laterally between the section 26 and section 30 of well 22, and the section 34 of well 24 is positioned laterally between the section 28 and section 30 of well 22.

The surface of the substrate 12 at the groove bottom 18 is masked during both implantations forming the wells 22, 24 and therefore the portion of the substrate 12 beneath the groove bottom 18 retains its original conductivity (e.g., lightly-doped p-type conductivity). The wells 22, 24 terminate at the corners 17 because the surface of the substrate 12 at the groove bottom 18 is masked during the implantations forming the wells 22, 24. Portions of the sidewalls 16 peripheral to the sections 26, 28 may also be masked during the implantation forming the well 22 and during the implantation forming the well 24. Therefore, the substrate 12 beneath these portions of the sidewalls 16 also retain the original conductivity of the substrate 12. The wells 22, 24 may contain moderately-doped semiconductor material.

Figure 5:
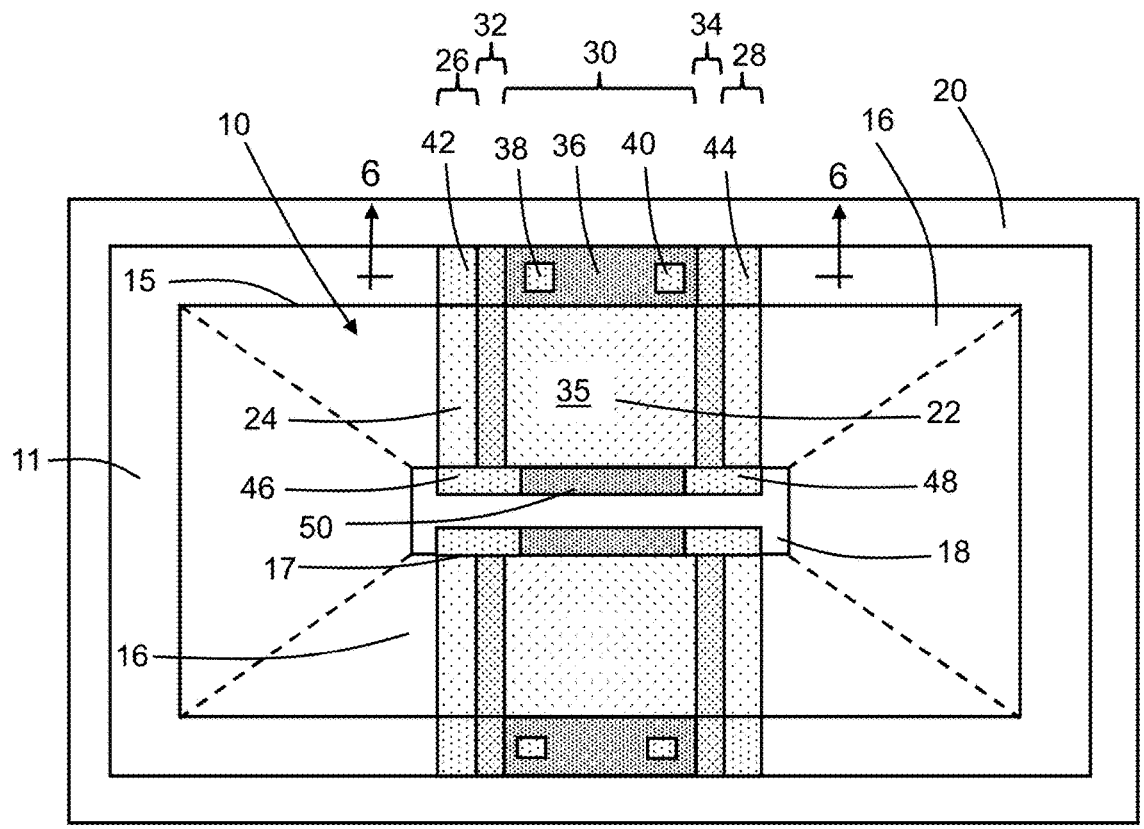
FIG. 5 is a top view of the structure for the Hall sensor at a fabrication stage subsequent to FIG. 3.
Figure 6:
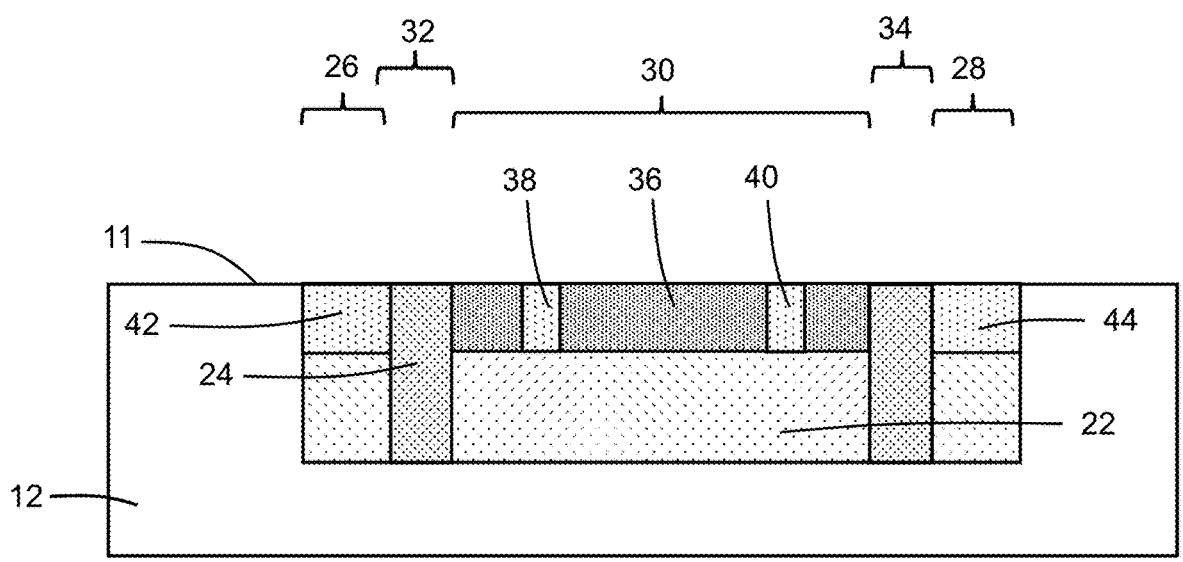
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, processing continues in parallel to form respective Hall sensors on each of the sidewalls 16. The subsequent discussion will address the formation of the Hall sensor on one of the sidewalls 16 with an understanding that another Hall sensor is being formed on the other of the sidewalls 16.

A doped region 36 is formed in a portion of the section 30 of the well 22, and contacts 38, 40 are formed as discrete doped regions in the doped region 36. The contacts 38, 40 have a conductivity type of an opposite polarity from the doped region 36. The doped region 36 and the contacts 38, 40 are located in the portion 13 of the substrate 12. The doped region 36 extends to a shallower depth into the substrate 12 than the well 22 such that a portion of the well 22 is retained beneath the doped region 36. The contacts 38, 40 are coupled to the portion of the well 22 beneath the doped region 36, which in turn couples the contacts 38, 40 with the section 30 of the well 22 beneath the sidewall 16. A portion of the doped region 36 is positioned between the contact 38 and the contact 40 to provide electrical isolation. The doped region 36 has the same conductivity type but a higher dopant concentration than the sections 32, 34.

Contacts 42, 44 are respectively formed as doped regions in the portions of the sections 26, 28 of the well 22 that are located in the portions 13 of the substrate 12 at the top surface 11. The contacts 42, 44 have the same conductivity type as the sections 26, 28 but with a higher dopant concentration, and are respectively coupled to the sections 26, 28 of the well 22. Contacts 46, 48 are respectively formed as doped regions in the portions of the substrate 12 at the groove bottom 18. Contact 46 couples the section 26 of the well 22 with the section 30 of the well 22. Contact 48 couples the section 28 of the well 22 with the section 30 of the well 22. The contacts 46, 48 have the same conductivity type as the sections 26, 28 but with a higher dopant concentration. A doped region 50 is also formed in the portion of the substrate 12 exposed at the groove bottom 18. The doped region 50 has an opposite conductivity type from the contacts 46, 48.

The doped regions 36, 50 may be formed by introducing a dopant by, for example, ion implantation at selected locations in the substrate 12. A patterned implantation mask may be used to define the selected locations for the doped regions 36, 50 and is stripped after implantation. In an embodiment in which the well 22 is n-type semiconductor material and the well 24 is p-type semiconductor material, the semiconductor material constituting the doped regions 36, 50 may contain a p-type dopant effective to impart p-type conductivity and may be heavily doped. Implantation conditions are selected to form each of the doped regions 36, 50 with a desired doping profile and concentration.

The contacts 38, 40, 42, 44, 46, 48 may be formed by introducing a dopant by, for example, ion implantation at selected locations in the substrate 12. A patterned implantation mask may be used to define the selected locations for the contacts 38, 40, 42, 44, 46, 48 and is stripped after implantation. In an embodiment in which the well 22 is n-type semiconductor material and the well 24 is p-type semiconductor material, the semiconductor material constituting the contacts 38, 40, 42, 44, 46, 48 may contain an n-type dopant effective to impart n-type conductivity and may be heavily doped. Implantation conditions are selected to form each of the doped regions 36, 50 with a desired doping profile and concentration.

The portion of the section 30 of the well 22 beneath the sidewall 16 is bounded by the doped region 36, the doped region 50, the sections 32 of well 24, and the section 34 of well 24. These boundaries define a Hall surface 35 of a given area (e.g., length and width) at the surface of the sidewall 16. The Hall surface 35 may extend over the full height of the sidewall 16 from the corner 15 to the corner 17, and the Hall surface 35 has a width, w, extending from one of the sections 32 of well 24 to the opposite one of the sections 34 of well 24. The Hall surface 35 is contained in a plane that is sloped with an inclination relative to the top surface 11 of the substrate 12 and that has a vertical component relative to a plane containing the top surface 11 of the substrate 12.

In the representative embodiment, the groove 10 is etched in the substrate 12 before the wells 22, 24 of opposite conductivity types are formed in substrate 12. In an alternative embodiment, the groove 10 may be etched in the substrate 12 after the wells 22, 24 of opposite conductivity types are formed in substrate 12, followed by the formation of the doped regions 36, 50 and the contacts 38, 40, 42, 44, 46, 48.

In use, a bias potential may be applied between terminals provided by the contact 38 and the contact 44 to establish a current flowing in the well 22. A magnetic field with a field direction that intersects the Hall surface 35 at the sidewall 16 will produce a Hall voltage. The Hall surface 35 defines the sensing surface of the Hall sensor. The interaction between the current and the magnetic field generates as a potential difference that is sensed between terminals provided by the contact 42 and the contact 40 at the Hall voltage. Due to the sloping of the sidewalls 16 that provides a non-planar geometry, the Hall sensor may sense a magnetic field characterized by a field direction that is parallel or nearly parallel to the top surface 11 of the substrate 12 with a greater sensitivity than a conventional Hall sensor.

Figure 7:
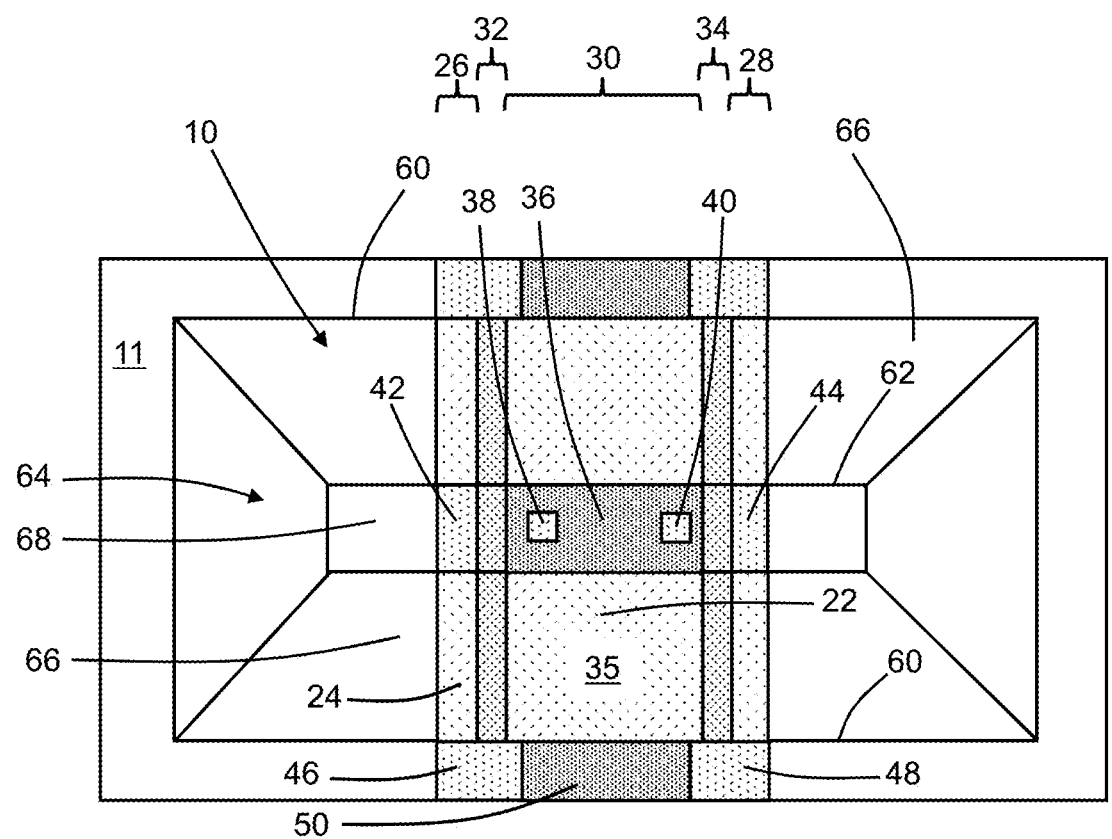
FIG. 7 is a top view of a structure for a Hall sensor in accordance with alternative embodiments of the invention.

With reference to FIG. 7 in which like reference numerals refer to like features in FIG. 5 and in accordance with alternative embodiments, the Hall sensor may be formed using a semiconductor fin 64 projecting from the top surface 11 of the substrate 12, instead of the groove 10 that is recessed relative to the top surface 11 of the substrate 12 as a cavity. The sidewalls 66 of the semiconductor fin 64 and the top surface 68 of the semiconductor fin 64 may be used to form the wells 22, 24, the doped regions 36, 50, and the contacts 38, 40, 42, 44, 46, 48 of the Hall sensor. Similar to the sidewalls 16 of the groove 10, the sidewalls 66 of the semiconductor fin 64 are inclined or angled relative to a plane containing the top surface 11 of the substrate 12. A portion of the top surface 11 of the substrate 12 surrounds a base of the semiconductor fin 64. The top surface 68 of the semiconductor fin 64 may be contained in a plane that is parallel to a plane of the top surface 11 of the substrate 12. Each of the sidewalls 66 intersects the top surface 68 at a corner 62 that extends along an upper edge of the sidewall 66. Each of the sidewalls 66 also intersects the top surface 11 of the substrate 12 at a corner 60 that extends along a lower edge of the sidewall 66. The top surface 68 of the semiconductor fin 64 may be rectangular at the corners 62, and the semiconductor fin 64 may have a similar rectangular shape at the corners 62.

The Hall surface 35 may extend over the full height of each sidewall 66 from the corner 15 to the corner 17, and the Hall surface 35 has a width extending from one of the sections 32 of well 24 to the opposite one of the sections 34 of well 24. The Hall surface 35 is contained in a plane that is sloped with an inclination relative to the top surface 68 of the semiconductor fin 64 and that has a vertical component relative to a plane containing the top surface 68 of the semiconductor fin 64.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a Hall sensor, the structure comprising:
a semiconductor body including a first surface and a sloped sidewall defining a Hall surface that intersects the first surface;
a first well in the semiconductor body, the first well having a first section positioned in part beneath the first surface and in part beneath the Hall surface; and
a plurality of contacts in the semiconductor body, each of the plurality of contacts coupled to the first section of the first well beneath the first surface of the semiconductor body.

2. The structure of claim 1 wherein the semiconductor body is a semiconductor substrate, the sloped sidewall extends from the first surface of the semiconductor substrate into the semiconductor substrate to define a portion of a groove, the plurality of contacts are a plurality of first doped regions in the semiconductor substrate, and the plurality of first doped regions are positioned beneath the first surface.

3. The structure of claim 2 wherein the Hall surface on the sloped sidewall and the first surface of the semiconductor substrate intersect at a first corner, the semiconductor substrate includes a second surface exposed at a bottom of the groove, and the Hall surface on the sloped sidewall and the second surface of the semiconductor substrate intersect at a second corner.

4. The structure of claim 2 wherein the Hall surface on the sloped sidewall and the first surface of the semiconductor substrate intersect at a corner, and further comprising:
a second doped region in the first section of the first well beneath the first surface,
wherein the plurality of first doped regions extend through the second doped region to the first section of the first well beneath the first surface.

5. The structure of claim 1 further comprising:
a semiconductor substrate having a top surface,
wherein the semiconductor body is a semiconductor fin that projects away from the top surface of the semiconductor substrate, the first surface is a top surface of the semiconductor fin, the Hall surface on the sloped sidewall is inclined at an angle relative to the top surface of the semiconductor fin, the plurality of contacts are a plurality of first doped regions in the semiconductor fin, and the plurality of first doped regions are positioned beneath the top surface of the semiconductor fin.

6. The structure of claim 5 wherein the Hall surface on the sloped sidewall and the top surface of the semiconductor fin intersect at a first corner, and the Hall surface on the sloped sidewall and the top surface of the semiconductor substrate intersect at a second corner.

7. The structure of claim 5 wherein the Hall surface on the sloped sidewall and the top surface of the semiconductor fin intersect at a corner, and further comprising:
a second doped region in the first section of the first well beneath the top surface of the semiconductor fin,
wherein the plurality of first doped regions extend through the second doped region to the first section of the first well beneath the top surface of the semiconductor fin.

8. The structure of claim 1 wherein the first well has a first conductivity type, and further comprising:
a second well in the semiconductor body, the second well having a first section and a second section that each extend along the sloped sidewall, and the second well having a second conductivity type of opposite polarity to the first conductivity type,
wherein the Hall surface on the sloped sidewall is positioned laterally between the first section of the second well and the second section of the second well.

9. The structure of claim 1 wherein the first well includes a second section beneath the first surface of the semiconductor body and extending along the sloped sidewall, and further comprising:
a second well in the semiconductor body, the second well having a first section laterally arranged in part between the second section of the first well and the Hall surface,
wherein the first well has a first conductivity type, and the second well has a second conductivity type of opposite polarity to the first conductivity type.

10. The structure of claim 9 wherein the first well includes a third section beneath the first surface of the semiconductor body and extending in the semiconductor body beneath the sloped sidewall, and the second well includes a second section laterally positioned in part between the third section of the first well and the Hall surface.

11. The structure of claim 10 wherein the plurality of contacts include a first contact and a second contact in the semiconductor body, the plurality of contacts have the first conductivity type with a higher dopant concentration than the first well, the first contact is coupled to the second section of the first well at the first surface of the semiconductor body, and the second contact is coupled to the third section of the first well at the first surface of the semiconductor body.

12. The structure of claim 11 further comprising:
a doped region in the semiconductor body at the first surface, the doped region having the second conductivity type, and the doped region including a portion positioned to isolate the first contact from the second contact.

13. The structure of claim 12 wherein the semiconductor body is a semiconductor substrate, the Hall surface on the sloped sidewall extends from the first surface of the semiconductor substrate into the semiconductor substrate to define a portion of a groove, the semiconductor substrate includes a second surface exposed at a bottom of the groove, and the doped region is positioned in the semiconductor substrate beneath the second surface.

14. The structure of claim 12 further comprising:
a semiconductor substrate having a top surface,
wherein the semiconductor body is a semiconductor fin that projects away from the top surface of the semiconductor substrate, the first surface is a top surface of the semiconductor fin, the Hall surface on the sloped sidewall is inclined at an angle relative to the top surface of the semiconductor fin, and the doped region is positioned in the semiconductor substrate beneath the top surface.

15. A method of forming structure for a Hall sensor, the method comprising:
forming a first well in a semiconductor body including a first surface and a sloped sidewall defining a Hall surface that intersects the first surface, wherein the first well has a first section positioned in part beneath the first surface and in part beneath the Hall surface; and forming a plurality of contacts in the semiconductor body, wherein each of the plurality of contacts is coupled to the first section of the first well beneath the first surface of the semiconductor body.

16. The method of claim 15 wherein the semiconductor body is a semiconductor substrate, and further comprising:

etching a groove in the semiconductor substrate, wherein the sloped sidewall extends from the first surface of the semiconductor substrate into the semiconductor substrate to define a portion of the groove.

17. The method of claim 16 wherein the semiconductor substrate includes a second surface exposed at a bottom of the groove, the Hall surface on the sloped sidewall and the second surface of the semiconductor substrate intersect at a first corner, and the Hall surface on the sloped sidewall and the second surface of the semiconductor substrate intersect at a second corner.

18. The method of claim 15 further comprising:

patterning a semiconductor fin that projects away from a top surface of a semiconductor substrate, wherein the first surface is a top surface of the semiconductor fin, and the Hall surface on the sloped sidewall is inclined at an angle relative to the top surface of the semiconductor fin.

19. The method of claim 15 wherein the first well has a first conductivity type, and further comprising:

forming a second well in the semiconductor body, wherein the second well has a first section and a second section that each extend along the sloped sidewall, the second well has a second conductivity type of opposite polarity to the first conductivity type, and the Hall surface on the sloped sidewall is positioned laterally between the first section of the second well and the second section of the second well.

20. The method of claim 15 wherein the first well includes a second section beneath the first surface of the semiconductor body and extending along the sloped sidewall, and further comprising:

forming a second well in the semiconductor body, wherein the second well has a first section laterally arranged in part between the second section of the first well and the Hall surface, the first well has a first conductivity type, and the second well has a second conductivity type of opposite polarity to the first conductivity type.

* * * * *